United States Patent
Maida et al.

(10) Patent No.: US 9,346,700 B2
(45) Date of Patent: May 24, 2016

(54) TITANIA-DOPED QUARTZ GLASS AND MAKING METHOD

(75) Inventors: Shigeru Maida, Joetsu-shi (JP); Hisatoshi Otsuka, Joetsu-shi (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 0 days.

(21) Appl. No.: 13/569,429

(22) Filed: Aug. 8, 2012

(65) Prior Publication Data

US 2013/0045439 A1    Feb. 21, 2013

(30) Foreign Application Priority Data

Aug. 18, 2011  (JP) .................... 2011-178758

(51) Int. Cl.

| | | |
|---|---|---|
| *C03B 19/14* | (2006.01) | |
| *C03C 3/06* | (2006.01) | |
| *G03F 1/24* | (2012.01) | |
| *B82Y 10/00* | (2011.01) | |
| *B82Y 40/00* | (2011.01) | |

(52) U.S. Cl.
CPC ........... *C03B 19/1415* (2013.01); *B82Y 10/00* (2013.01); *B82Y 40/00* (2013.01); *C03C 3/06* (2013.01); *G03F 1/24* (2013.01); *C03B 2201/42* (2013.01); *C03B 2207/06* (2013.01); *C03B 2207/12* (2013.01); *C03B 2207/20* (2013.01); *C03B 2207/81* (2013.01); *C03C 2201/42* (2013.01); *C03C 2203/42* (2013.01); *Y02P 40/57* (2015.11)

(58) Field of Classification Search
CPC ............. C03B 2207/46; C03B 2207/81
USPC ............................ 65/17.4; 430/5
See application file for complete search history.

(56) References Cited

U.S. PATENT DOCUMENTS

| | | | | |
|---|---|---|---|---|
| 4,661,140 | A * | 4/1987 | Takimoto et al. | 65/157 |
| 4,976,943 | A * | 12/1990 | Pauli et al. | 423/336 |
| 6,672,110 | B2 * | 1/2004 | Roba et al. | 65/384 |
| 8,012,653 | B2 | 9/2011 | Koike et al. | |
| 2002/0157421 | A1 * | 10/2002 | Ackerman | C03B 19/1415 65/17.6 |
| 2010/0028787 | A1 | 2/2010 | Koike et al. | |
| 2010/0243950 | A1 | 9/2010 | Harada et al. | |
| 2012/0121857 | A1 | 5/2012 | Koike et al. | |

FOREIGN PATENT DOCUMENTS

| | | |
|---|---|---|
| EP | 1 795 506 A1 | 6/2007 |
| EP | 2 003 098 A1 | 12/2008 |
| JP | 2010-135732 A | 6/2010 |
| WO | 99/54259 A1 | 10/1999 |

(Continued)

OTHER PUBLICATIONS

European Search Report dated Dec. 11, 2013, issued in European Patent Application No. 12179819.3, (6 pages).

*Primary Examiner* — Angela Ortiz
*Assistant Examiner* — Cynthia Szewczyk
(74) *Attorney, Agent, or Firm* — Westerman, Hattori, Daniels & Adrian, LLP

(57) ABSTRACT

Titania-doped quartz glass is manufactured by mixing a silicon-providing reactant gas and a titanium-providing reactant gas, preheating the reactant gas mixture at 200-400° C., and subjecting the mixture to oxidation or flame hydrolysis. A substrate of the glass is free of concave defects having a volume of at least 30,000 nm³ in an effective region of the EUV light-reflecting surface and is suited for use in the EUV lithography.

6 Claims, 2 Drawing Sheets

(56) References Cited

FOREIGN PATENT DOCUMENTS

| | | |
|---|---|---|
| WO | 01/92172 A1 | 12/2001 |
| WO | 2009/107858 A1 | 9/2009 |
| WO | 2009/145288 A1 | 12/2009 |
| WO | 2009/150938 A1 | 12/2009 |
| WO | 2010/131662 A1 | 11/2010 |

* cited by examiner

TITANIA-DOPED QUARTZ GLASS AND MAKING METHOD

CROSS-REFERENCE TO RELATED APPLICATION

This non-provisional application claims priority under 35 U.S.C. §119(a) on Patent Application No. 2011-178758 filed in Japan on Aug. 18, 2011, the entire contents of which are hereby incorporated by reference.

TECHNICAL FIELD

This invention relates to titania-doped quartz glass suited for use in the EUV lithography, and a method for manufacturing the glass.

BACKGROUND ART

The advanced lithography process for the fabrication of semiconductor devices favors a light source of shorter wavelength for exposure. A subsequent transition to lithography using extreme ultraviolet (EUV) is regarded promising.

The EUV lithography uses a reflecting optical system. While EUV light has a short wavelength of 13.5 nm, there are available no materials having high transmittance at that wavelength. EUV light is reflected by a Si/Mo multilayer film sputtered on a surface of a substrate of low coefficient of thermal expansion (CTE) material.

Fabrication of defect-free photomasks is one of the outstanding problems that must be overcome before the EUV lithography can be implemented on a commercial basis. While irregularities or defects on the surface of a photomask substrate are permissible in the KrF (wavelength 248.3 nm) and ArF (wavelength 193.4 nm) lithography employing conventional dioptric system, defects of the same order are not negligible in the EUV lithography because of the shortness of exposure wavelength and the reflecting optical system.

The EUV lithography photomask bears defects which are generally divided into three types: 1) surface defects of a low CTE material substrate, 2) defects in a reflecting multilayer film, and 3) defects on a pattern. As the sputtering conditions are ameliorated and the cleaning technology is improved, the number of defects on the EUV lithography photomask is reduced. However, many defects are still found on the polished surface of low CTE material substrate. Toward the commercial implementation of the EUV lithography, it is urgently required to reduce defects on the polished surface of low CTE material substrate.

Titania-doped quartz glass is well known as the low CTE material which is used in the reflecting optical system for the EUV lithography. The addition of a certain amount of titania is effective for reducing the CTE of quartz glass. Because of titania doping, however, technical difficulty arises in manufacturing photomask substrates which meet the requirements of defect-free and high flatness for the EUV lithography application.

When titania-doped quartz glass has a non-uniform titania concentration, it is difficult to manufacture substrates having a high flatness from such glass. Striae may be formed during manufacture of titania-doped quartz glass. For example, if the reactant gas supply is inconsistent (that is, the silicon and titanium-providing reactant gases are not supplied at constant flow rates), and/or if the temperature of the growth face of a titania-doped quartz glass ingot fluctuates due to variations of the flow rates of oxygen and hydrogen gases supplied simultaneously, the titania concentration becomes non-uniform, generating distinct sites, known as striae. When striated substrates are polished, irregularities are formed on the substrate surface because striae are different in reactivity with the polishing fluid and abrasion rate.

On the other hand, as compared with undoped quartz glass substrates, titania-doped quartz glass substrates tend to bear many defects on their surface after polishing and cleaning. The defects on the substrate surface may be divided into two: convex defects resulting from foreign particles left after polishing and cleaning and high-hardness inclusions within quartz glass emerging at the surface; and concave defects resulting from local high-polishing-rate inclusions within quartz glass emerging at the surface.

Titania-doped quartz glass for use as the material from which EUV lithographic members are made tends to bear more concave defects, which interfere with the manufacture of defect-free photomasks.

JP-A 2010-135732 and WO 2010/131662 describe silica glass substrates. Allegedly, it is preferred that concave pits of at least 60 nm be absent on the substrate surface of a surface quality area. However, the method for manufacturing silica glass substrates so as to eliminate concave pits of at least 60 nm is described nowhere. It is more preferred in view of mask quality that concave pits of at least 40 nm are absent on the substrate surface of a surface quality area. However, mask substrates in which concave pits of at least 40 nm are absent are described nowhere, even in Examples. Also means for measuring defects of 40 nm is described nowhere.

WO 2009/145288 describes that silica glass substrates are preferably free of inclusions which are believed to cause concave defects. However, it is not described even in Examples whether or not inclusions are found in silica glass. Also means for detecting such inclusions is described nowhere.

Even in the case of titania-doped quartz glass in which no inclusions have been found by the standard light collimating detection test, concave defects are often found on its surface after it is polished.

For the goal of defect-free polished surface, it has been a common practice to optimize polishing and cleaning conditions so as to reduce convex and concave defects. Also for the purpose of reducing inclusions in titania-doped quartz glass which cause defects on the polished surface, it is known in connection with the indirect manufacture of titania-doped quartz glass to accurately control temperature conditions during heat treatment for homogenizing titania-doped porous silica matrix ($TiO_2$—$SiO_2$ consolidated body), vitrification, and shaping of $TiO_2$—$SiO_2$ glass body.

CITATION LIST

Patent Document 1: JP-A 2010-135732 (U.S. Pat. No. 8,012,653)
Patent Document 2: WO 2010/131662
Patent Document 3: WO 2009/145288

SUMMARY OF INVENTION

An object of the invention is to provide a titania-doped quartz glass used to form an EUV lithography member having a surface for reflecting EUV light, which surface is free of concave defects having a volume of at least 30,000 $nm^3$ and an aspect ratio of up to 10 in an effective region, and a method for manufacturing the titania-doped quartz glass.

The inventors have found that a titania-doped quartz glass can be manufactured by mixing a silicon-providing reactant gas and a titanium-providing reactant gas, preheating the reactant gas mixture at 200 to 400° C., and subjecting the mixture to oxidation or flame hydrolysis with the aid of a combustible gas and a combustion-supporting gas and that the resulting titania-doped quartz glass can be used to form an EUV lithography member having a surface for reflecting EUV light, which surface is free of concave defects having a volume of at least 30,000 nm$^3$ and an aspect ratio of up to 10 in an effective region.

Accordingly, the invention provides a method for manufacturing a titania-doped quartz glass, comprising the steps of mixing a silicon-providing reactant gas and a titanium-providing reactant gas, heating the reactant gas mixture at 200 to 400° C., and subjecting the mixture to oxidation or flame hydrolysis with the aid of a combustible gas and a combustion-supporting gas.

In a preferred embodiment, the method may further comprise the steps of providing a burner for injecting the reactant gas mixture, the combustible gas, and the combustion-supporting gas, the burner including a central tube for injecting the reactant gas mixture, connecting a glass or glass-lined conduit at its downstream end to the central tube for feeding the reactant gas mixture through the glass or glass-lined conduit to the central tube, and heating and holding the reactant gas mixture at 200 to 400° C. in the glass or glass-lined conduit.

The preferred method may further comprise the steps of connecting a metal conduit to the glass or glass-lined conduit at its upstream end, and holding an upstream end portion of the glass or glass-lined conduit connected to the metal conduit at 100 to 130° C.

In a further preferred embodiment, the burner comprises a central multi-fold tube section and a multi-nozzle section, the central multi-fold tube section including the central tube and a second tube enclosing the central tube, the reactant gas mixture is injected through the central tube, and the combustion-supporting gas is injected through the second tube while being heated at 200 to 400° C.

In another aspect, the invention provides a titania-doped quartz glass having a surface where EUV light is reflected, the glass being free of concave defects having a volume of at least 30,000 nm$^3$ and an aspect ratio of up to 10 in an effective region of the EUV light-reflecting surface. Preferably the titania-doped quartz glass is free of inclusions.

In a further aspect, the invention provides an EUV lithographic member comprising the titania-doped quartz glass defined above. The EUV lithographic member is typically an EUV lithographic photomask substrate.

Advantageous Effects of Invention

Since the EUV reflecting surface of a titania-doped quartz glass substrate is free of concave defects having a volume of at least 30,000 nm$^3$, the titania-doped quartz glass is suited for use in the EUV lithography, especially as EUV lithographic photomask substrates.

DESCRIPTION OF EMBODIMENTS

Figure 1:
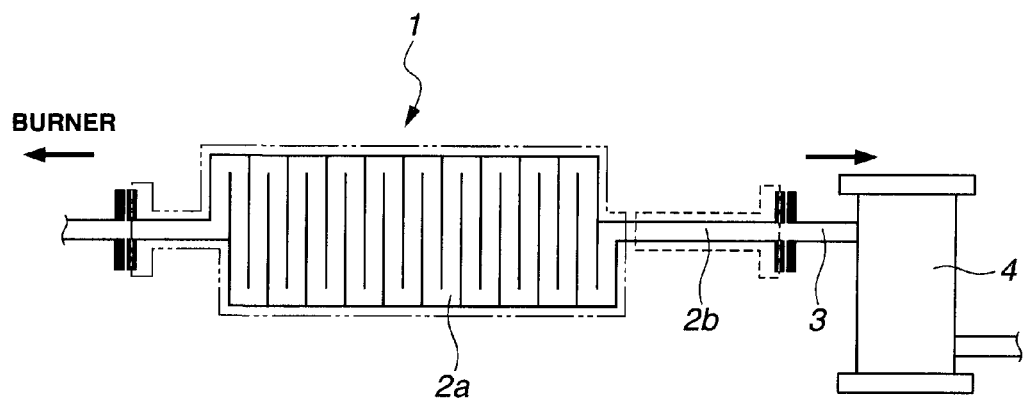
FIG. 1 schematically illustrates an exemplary reactant gas mixture heating mechanism.

One embodiment of the invention is a titania-doped quartz glass having a surface where EUV light is reflected, the glass being free of concave defects having a volume of at least 30,000 nm$^3$ in an effective region of the EUV light-reflecting surface. Preferably, the titania-doped quartz glass is free of concave defects having a volume of at least 20,000 nm$^3$, more preferably at least 15,000 nm$^3$.

Using the titania-doped quartz glass free of concave defects in an effective region of the EUV light-reflecting surface as a photomask substrate, a photomask free of line cuts or short-circuits, having improved CD uniformity, and suited for EUV lithography is obtainable.

The term "effective region" of the EUV light-reflecting surface refers to a surface region of an EUV lithographic member where EUV light is reflected. Specifically in the case of a photomask, it refers to a region where a circuit to be transferred to a silicon wafer is written. In the case of a photomask substrate of 152.4 mm×152.4 mm squares, it generally refers to a central region of 142 mm×142 mm squares within the photomask substrate.

In the one embodiment, the titania-doped quartz glass is also free of concave defects having an aspect ratio of up to 10. Those concave defects having an aspect ratio in excess of 10 are introduced by the polishing and cleaning steps of titania-doped quartz glass, rather than originating from the bulk of titania-doped quartz glass. It is noted that the aspect ratio is a ratio of major side to minor side of a concave defect in the member surface.

In a preferred embodiment, the titania-doped quartz glass is free of inclusions because the presence of inclusions can be a cause of concave defects in the polished surface.

Another embodiment is a method for manufacturing titania-doped quartz glass free of concave defects having a volume of at least 30,000 nm$^3$ in an effective region of the EUV light-reflecting surface, or titania-doped quartz glass free of inclusions. The desired glass is manufactured by mixing a silicon-providing reactant gas and a titanium-providing reactant gas, heating the reactant gas mixture at 200 to 400° C., and feeding the mixture to a synthetic quartz burner where the mixture is subjected to oxidation or flame hydrolysis with the aid of a combustible gas and a combustion-supporting gas. Although the reason why the step of preheating the reactant gas mixture at a high temperature results in minimization of concave defects in the surface is not well understood, it is believed that the previous exposure of the reactant gas mixture to high temperature improves the mixing evenness and reactivity of reactant gases, allows the mixed reactant gases to undergo reaction immediately after injection from the burner, and thus effectively contribute to formation of silica-titania fine particles which are uniform in both composition and particle size.

In order that the reactant gas mixture be heated and held at a high temperature of 200 to 400° C., the reactivity of a material of a gas conduit with the reactant gases must be taken into account. A glass or glass-lined conduit is preferably used as the conduit where the reactant gas mixture is held at a high temperature. Specifically, quartz glass is used as the glass or glass-lined conduit to avoid contamination with incidental impurities. While the glass or glass-lined conduit serves to heat and hold the reactant gas mixture at a high temperature of 200 to 400° C., the temperature of a portion (or upstream end side) of the glass or glass-lined conduit which is disposed near the connection to a metal conduit, typically stainless steel conduit, is preferably lowered to the normal conduit heating temperature of 100 to 130° C. If the temperature of the metal conduit connected to the glass or glass-lined conduit is elevated by heat transfer from the glass or glass-lined conduit, then the metal conduit can be corroded with the reactant gas mixture, which can cause introduction of impurities, eventual generation of inclusions within the titania-doped quartz glass, and formation of concave defects.

When the reactant gas mixture is held at a high temperature of 200 to 400° C., preferably the mixture is heated immediately before entry into the synthetic quartz burner. A shortened distance from this heating zone to the injection outlet of the synthetic quartz burner for creating the reaction site of the reactant gas mixture makes it easy to keep the temperature of the reactant gas mixture until the reaction site is reached. In this sense, the glass or glass-lined conduit for feeding, heating and holding the reactant gas mixture at a high temperature of 200 to 400° C. is preferably connected directly to the central tube of the burner for injecting the reactant gas mixture.

Where a filter is interposed in a reactant gas mixture feed line, preferably the glass or glass-lined conduit for feeding, heating and holding the reactant gas mixture at a high temperature of 200 to 400° C. is positioned immediately downstream of the filter.

FIG. 1 schematically illustrates one exemplary reactant gas mixture heating mechanism 1. The heating mechanism 1 includes one end portion or upstream end portion 2b which is coupled to a metal conduit section 3. The metal conduit section 3 has a filter 4 interposed near its downstream end. The heating mechanism 1 includes another end portion or downstream end portion which is coupled to a central tube 11 of a burner for injecting a reactant gas mixture. The heating mechanism 1 is constructed by a glass conduit or glass-lined conduit. The glass or glass-lined conduit includes a hot heating portion 2a (delineated by the two-dots-and-dash line) and an upstream end portion 2b (delineated by the dot line) coupled to the metal conduit 3. Preferably the hot heating portion 2a (also referred to as heating zone I) is heated at a high temperature of 200 to 400° C., whereas the upstream end portion 2b (also referred to as heating zone II) is heated at an ordinary conduit heating temperature of 100 to 130° C. It is acceptable that the upstream end portion 2b (or heating zone II) be heated at a temperature of 200 to 400° C. as well.

The reactant gas mixture used herein is a mixture of a silicon-providing reactant gas and a titanium-providing reactant gas. If desired, a combustion-supporting gas such as oxygen gas may be admixed in this mixture.

The silicon-providing reactant gas used herein may be selected from well-known organosilicon compounds, for example, silicon tetrachloride, chlorosilanes such as dimethyldichlorosilane and methyltrichlorosilane, and alkoxysilanes such as tetramethoxysilane, tetraethoxysilane, and methyltrimethoxysilane.

The titanium-providing reactant gas used herein may also be selected from well-known compounds, for example, titanium halides such as titanium tetrachloride and titanium tetrabromide, and titanium alkoxides such as tetraethoxytitanium, tetraisopropoxytitanium, tetra-n-propoxytitanium, tetra-n-butoxytitanium, tetra-sec-butoxytitanium, and tetra-t-butoxytitanium.

A mixing proportion of silicon-providing reactant gas and titanium-providing reactant gas may be determined in accordance with the desired titania content of titania-doped quartz glass. It is noted that the titania content of titania-doped quartz glass is preferably 4 to 12% by weight, more preferably 5 to 10% by weight. Where a combustion-supporting gas is admixed in the reactant gas mixture, a molar amount of the combustion-supporting gas is preferably at least 8 times, more preferably at least 10 times the total moles of silicon and titanium-providing reactant gases.

According to the invention, titania-doped quartz glass may be prepared by feeding the reactant gas mixture, a combustible gas and a combustion-supporting gas to a burner. The burner typically of synthetic quartz preferably comprises a central multi-fold tube section and a multi-nozzle section. The central multi-fold tube section includes a reactant gas injecting nozzle at the center and a plurality of concentrically arranged nozzles. The plurality of nozzles receive combustion-supporting gas or combustible gas. On the other hand, the multi-nozzle section includes small-diameter nozzles arranged in rows concentric with respect to the central reactant gas injecting nozzle for injecting combustion-supporting gas and a space outside the small-diameter nozzles for injecting combustible gas. In a preferred embodiment of the invention, the gas flowing through the nozzle (second tube) arranged adjacent to the central reactant gas injecting nozzle is heated to an equivalent temperature to the reactant gas mixture. Since it is difficult from the structural aspect to heat the nozzles of the synthetic quartz burner independently, the temperature of the gas flowing through the second tube which is lower than the reactant gas mixture can lower the temperature of the heated reactant gas mixture.

Figure 2:
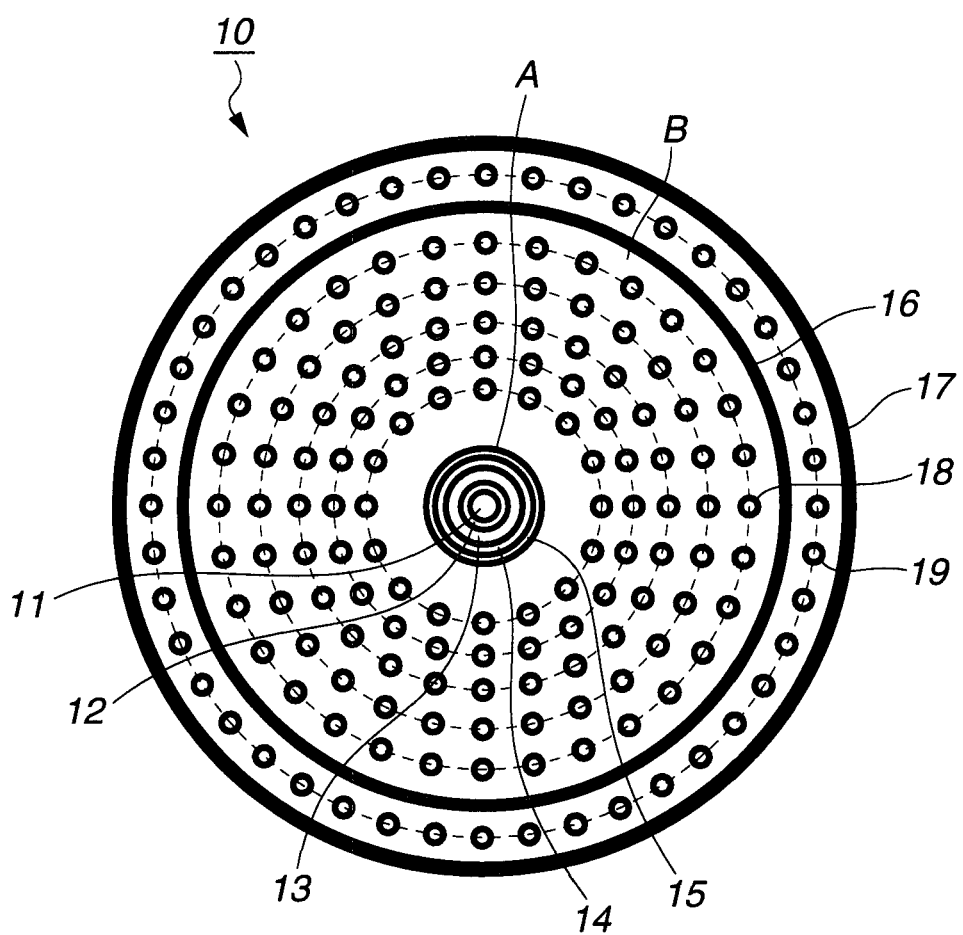
FIG. 2 is a transverse section of a gas injection outlet of a burner used for the manufacture of titania-doped quartz glass in Examples.

Specifically, the preferred burner is of the structure shown in FIG. 2. The burner 10 is illustrated in FIG. 2 as comprising a central multi-fold tube section A at the center and a multi-nozzle section B enclosing section A. The central multi-fold tube section A includes a central tube (or nozzle) 11 for injecting the reactant gas mixture, a first combustion-supporting gas feed tube 12 enclosing the central tube 11, a first combustible gas feed tube 13 enclosing the tube 12, a second combustion-supporting gas feed tube 14 enclosing the tube 13, and a second combustible gas feed tube 15 enclosing the tube 14, in a concentric telescopic arrangement. The multi-nozzle section B includes a first shell 16 disposed outside and enclosing the second combustible gas feed tube 15, and a second shell 17 disposed outside and enclosing the first shell 16. A multiplicity of third combustion-supporting gas feed tubes 18 are disposed between the second combustible gas feed tube 15 and the first shell 16, in five rows concentric with the central tube 11 while combustible gas is fed through the remaining space within the first shell 16 (outside third combustion supporting gas feed tubes 18). A multiplicity of fourth combustion-supporting gas feed tubes 19 are disposed between the first and second shells 16 and 17 in a concentric row while combustible gas is fed through the remaining space within the second shell 17 (outside fourth combustion supporting gas feed tubes 19).

In the preparation of titania-doped quartz glass according to the invention, the central multi-fold tube section A of the burner preferably includes at least three tubes, and more preferably at least five tubes. A multiplicity of third combustion-supporting gas feed tubes 18 in the multi-nozzle section B are disposed preferably in five rows, more preferably in six rows concentric with the central multi-fold tube.

The combustible gas used herein may be hydrogen or hydrogen-containing gas, optionally in combination with another gas such as carbon monoxide, methane or propane. The combustion-supporting gas used herein may be oxygen or oxygen-containing gas.

In the method for the preparation of titania-doped quartz glass, the reactant gas mixture is preferably fed at a linear velocity of at least 55 m/sec, more preferably 60 to 100 m/sec. This is because the reactant gas mixture is kept at the high temperature and thus highly reactive. If the linear velocity of the reactant gas mixture is slow, silica-titania fine particles created may deposit on the burner tip and scatter therefrom, becoming inclusions in titania-doped quartz glass and causing concave defects.

In the method for the preparation of titania-doped quartz glass, oxygen gas as the combustion-supporting gas and hydrogen gas as the combustible gas are fed through the multi-nozzle section and the central multi-fold tube section of the burner. Preferably, oxygen in excess of the stoichiometry, specifically in the range: $1.7 \leq H_2/O_2$ ratio<2, is available in at least one, more preferably both of the multi-nozzle section and the central multi-fold tube section. If hydrogen in excess of the stoichiometry (specifically $H_2/O_2$ ratio≥2) is available in both the multi-nozzle section and the central multi-fold tube section, then titania-doped quartz glass can be colored and at the same time, microcrystalline titanium oxide is likely to form.

In another preferred embodiment, the combustible gas, typically hydrogen gas is injected through the burner at a linear velocity of less than or equal to 100 m/sec, more preferably less than or equal to 90 m/sec. If the linear velocity of hydrogen gas injected as the combustible gas through the burner is higher than 100 m/sec, the titania-doped quartz glass prepared under such conditions may have the risk of thermal hysteresis on use as the EUV lithography member. The linear velocity of the combustible gas, typically hydrogen gas is usually at least 0.5 m/sec, and preferably at least 1 m/sec though the lower limit is not critical.

According to the invention, titania-doped quartz glass may be prepared by feeding a combustible gas containing hydrogen and a combustion-supporting gas containing oxygen to a burner built in a quartz glass-manufacturing furnace, burning the gases to form an oxyhydrogen flame at the burner tip, feeding a silicon-providing reactant gas and a titanium-providing reactant gas through the burner into the flame for subjecting the reactant gases to oxidation or flame hydrolysis to thereby form silica, titania and composite fine particles, depositing the fine particles on a target horizontally disposed forward of the burner, and concurrently melting and vitrifying the deposited particles to grow titania-doped quartz glass to form an ingot, hot shaping the ingot into a predetermined shape, and annealing and slowly cooling the shaped ingot. This is known as the horizontal direct process.

If the vertical direct process is used, it is difficult due to the furnace structure to avoid fragments of insulator and other members disposed above the growth face of a titania-doped quartz glass ingot from spalling off and depositing on the ingot growth face. Such fragments can become inclusions in titania-doped quartz glass and cause concave defects on the surface.

Also, when the indirect process is used for the preparation of titania-doped porous silica matrix, it is relatively easy to avoid contamination of the matrix with foreign particles. However, bubbles are often left after vitrification of titania-doped porous silica matrix. The bubbles can be apparently extinguished during subsequent heat treatment, typically hot shaping of titania-doped quartz glass. However, the extinction occurs as a result of the gas in bubbles being dissolved in titania-doped quartz glass, indicating that structurally sparse regions are formed within the titania-doped quartz glass. Such sparse regions in titania-doped quartz glass allow for a higher machining rate during polishing and are thus prone to cause concave defects.

During preparation of titania-doped quartz glass, that is, titania-doped porous silica matrix, it is desired to avoid contamination of the silica matrix with foreign particles. To this end, air to be fed to the furnace must be passed through a filter beforehand. Additionally, a vent is preferably provided on an extension in the direction of injection of silicon and titanium-providing reactant gases through the synthetic quartz burner, so that titania-doped silica fine particles may not deposit on the furnace inner wall.

During preparation of titania-doped quartz glass, the target is typically rotated at a rotational speed of at least 5 rpm, preferably at least 15 rpm, and more preferably at least 30 rpm. This is because structurally or compositionally non-uniform zones (like striae and strains) which are undesired on use of titania-doped quartz glass as EUV lithographic members generate, depending largely on the unevenness of temperature in a portion where titania-doped quartz glass grows on the rotating target. Then the generation of structurally or compositionally non-uniform zones in titania-doped quartz glass can be inhibited by increasing the rotational speed of the target so that an even temperature may be available in a portion where titania-doped quartz glass grows.

Preferably the titania-doped quartz glass ingot thus prepared is then heat treated at a temperature of 700 to 1,150° C. for at least 50 hours, thereby removing hydrogen molecules from within the glass. Specifically titania-doped quartz glass has such a hydrogen molecule concentration that the peak near 4,135 cm$^{-1}$ attributable to hydrogen molecule is below the detection limit on measurement by Raman spectroscopy using a spectrometer NRS-2100 (JASCO Corp.) and a 4-W argon ion laser as an excitation light source. This is because titania-doped quartz glass containing more hydrogen molecules tends to generate bubbles therein when it is hot shaped into the desired shape.

In order that the titania-doped quartz glass ingot be shaped into a desired shape suited for a particular EUV lithography member such as a mirror, stage or photomask substrate, it is hot shaped at a temperature of 1,500 to 1,800° C. for 1 to 10 hours. After the hot shaping, the titania-doped quartz glass is annealed. Annealing may be conducted under well-known conditions, for example, by holding at a temperature of 700 to 1,300° C. in air for 1 to 200 hours. This may be followed by slow cooling. Although slow cooling for titania-doped quartz glass is generally down to about 500° C., the invention prefers slow cooling down to 300° C., more preferably down to 200° C. The slow cooling rate is preferably 1 to 20° C./hr, more preferably 1 to 10° C./hr.

After the annealing/slow cooling treatment, the titania-doped quartz glass is processed into a predetermined size by machining or slicing and then polished by a double-side lapping machine with an abrasive such as silicon oxide, aluminum oxide, molybdenum oxide, silicon carbide, diamond, cerium oxide or colloidal silica, thereby forming an EUV lithography member. The polishing method of WO 2009/150938 is preferably employed herein in order to inhibit concave defects from generating during double-side lapping.

For observation of concave defects on the polished surface, a light source having the exposure wavelength (λ=13.5 nm) of the EUV lithography is used because fine size defects must be measured. Conventional flaw detectors using visible light and UV light are difficult to detect defects of the size contemplated herein. Since titania-doped quartz glass has a low reflectance at the exposure wavelength of the EUV lithography, a reflective multilayer film is previously deposited on the surface by sputtering. The reflective multilayer film is typically a stack of Si layers of 4.5 nm thick and Mo layers of 2.3 nm alternately disposed in 5 periodicities. Concave defects are observed by monitoring reflecting light from the reflective multilayer film on the surface. If a concave defect is present on the surface, then the reflective multilayer film is deformed conformal to the defect configuration, and thus the reflecting light from the reflective multilayer film provides substantially the same signal as the signal directly from the defect.

Concave defects are measured by irradiating EUV light from an EUV light source (Energetiq Technology, Inc.) to the reflective multilayer film on a titania-doped quartz glass member, collecting reflected light through a Schwarzschild optical system having a magnification of 20×, and sensing it by a CCD camera. It is noted that concave defect measurement is conducted as dark field observation, and an effective region in the EUV light reflecting surface of the EUV lithography member is scan in entirety. The reflective multilayer film at the position of the member where a signal assigned to a defect is obtained is observed under AFM to determine its geometry and topography, from which the volume of the defect is computed and reported as the volume of a concave defect on the surface. Also an aspect ratio is determined from the defect geometry obtained by AFM observation.

Inclusions are measured by coupling a visible light source with a spot light source (Hamamatsu Photonics Co., Ltd.) and scanning the effective region of the EUV light reflecting surface in entirety. The visible light irradiated site is magnified and observed under an optical microscope to see whether or not inclusions including bubbles, crystallized sites and local refractive index variations (corresponding to variations of composition, e.g., $TiO_2$ concentration or OH group concentration, local variations of glass structure, and the like) are present. Also, by similar scanning of the effective region in entirety aside from using a UV light source (250 nm enhancement mode), and simultaneous optical microscope observation, any fluorescent color change of titania-doped quartz glass due to contamination with impurities is observed.

EXAMPLE

Examples and Comparative Examples are given below for further illustrating the invention although the invention is not limited thereto.

Example 1

A titania-doped quartz glass ingot was prepared by placing a quartz glass burner as shown in FIG. 2 relative to a target, feeding gases ($SiCl_4$, $TiCl_4$, $O_2$, $H_2$) to respective nozzles of the burner as shown in Table 1, forming an oxyhydrogen flame, effecting oxidation or flame hydrolysis of silicon tetrachloride and titanium tetrachloride in the oxyhydrogen flame to produce $SiO_2$ and $TiO_2$, depositing silica and titania fine particles on the target, and concurrently melting and vitrifying the particles. The target was disposed forward of the burner at a distance 280 mm and an angle of 128° relative to the burner. During the process, the target was rotated at 50 rpm and retracted at 10 mm/hr. A reactant gas mixture heating mechanism 1 including heating zones I and II as shown in FIG. 1 was installed immediately upstream of the burner and immediately downstream of a reactant gas mixture filter 4. The heating zones I and II were held at 375° C. and 125° C., respectively. Also the oxygen gas flow through the second tube of the central multifold tube section of the burner was held at 375° C. A stainless steel conduit was used as the metal conduit 3 and held at 125° C.

The resulting titania-doped quartz glass ingot was heat treated at 1,100° C. for 100 hours to remove hydrogen from within the glass. Samples were taken from opposite ends of the ingot and analyzed by Raman spectroscopy, but peaks assigned to hydrogen molecule were not observed. The titania-doped quartz glass ingot was hot shaped into a square column of 160 mm×160 mm by heating at 1700° C. for 6 hours. The column was sliced into substrates of 7 mm thick. The substrates were annealed in a furnace lined with high-purity porous silicon carbide insulator by holding in air at 850° C. for 150 hours and then slowly cooled at a rate of 2° C./hr to 200° C. The substrates were ground on edge surfaces to a square shape of 152.4 mm×152.4 mm whereupon they were further polished, cleaned and dried in accordance with Example 1 of WO 2009/150938. An inclusion inspection test was carried out on these substrates using visible and UV light sources.

After the titania-doped quartz glass substrates were cleaned and dried again, a reflective multilayer film was deposited thereon. Concave defects on the surface covered with the reflective multilayer film were measured.

Example 2

Titania-doped quartz glass was prepared under the same conditions as in Example 1 except that the temperature of heating zone I of the reactant gas mixture heating mechanism 1 was 300° C.

Example 3

Titania-doped quartz glass was prepared under the same conditions as in Example 1 except that the temperature of heating zone I of the reactant gas mixture heating mechanism 1 was 220° C. and the oxygen gas flow through the second tube of the burner central multifold tube section was held at room temperature (20° C.).

Example 4

Titania-doped quartz glass was prepared under the same conditions as in Example 1 except that the temperature of heating zone II of the reactant gas mixture heating mechanism 1 was 375° C.

Comparative Example 1

The reactant gas mixture heating mechanism was removed from the system of Example 1. That is, the stainless steel conduit was directly coupled to the burner. The stainless steel conduit was held at a temperature of 125° C. The oxygen gas flow through the second tube of the burner central multifold tube section was held at room temperature (20° C.). The remaining conditions were the same as in Example 1.

Comparative Example 2

A titania-doped quartz glass ingot was prepared by using a quartz glass burner as shown in FIG. 2 and feeding gases ($SiCl_4$, $TiCl_4$, $O_2$, $H_2$) to respective nozzles of the burner as shown in Table 1. The remaining conditions were the same as in Example 1.

TABLE 1

| | | | Cross-sectional area, $mm^2$ | Gas flow rate, $Nm^3/hr$ (reactant gas linear velocity, m/sec) | |
|---|---|---|---|---|---|
| | | Gas | | Example 1 to 4, Comparative Example 1 | Comparative Example 2 |
| Central multifold tube section | 1st tube | $SiCl_4$ $TiCl_4$ $O_2$ | 10.18 | 1,420 g/hr 190 g/hr 2.25 (67.1) | 1,150 g/hr 150 g/hr 1.65 (49.6) |
| | 2nd tube | $O_2$ | 19.47 | 0.60 | 0.55 |
| | 3rd tube | $H_2$ | 49.46 | 15.00 | 14.50 |
| | 4th tube | $O_2$ | 37.18 | 9.00 | 8.00 |
| | 5th tube | $H_2$ | 37.04 | 5.20 | 4.50 |
| Multi-nozzle | Inside nozzle | $O_2$ | 241.15 | 12.50 | 11.00 |
| | Inside shell | $H_2$ | 6161 | 25.00 | 21.00 |

TABLE 1-continued

| | Gas | Cross-sectional area, mm² | Gas flow rate, Nm³/hr (reactant gas linear velocity, m/sec) | |
|---|---|---|---|---|
| | | | Example 1 to 4, Comparative Example 1 | Comparative Example 2 |
| section | Outside nozzle | $O_2$ | 88.42 | 5.00 | 4.00 |
| | Outside shell | $H_2$ | 2286 | 6.00 | 5.00 |

TABLE 2

| | | Example | | | | Comparative Example | |
|---|---|---|---|---|---|---|---|
| | | 1 | 2 | 3 | 4 | 1 | 2 |
| Concave defects (volume V, nm³) | $15,000 \leq V < 20,000$ | 0 | 0 | 16 | 94 | 225 | 428 |
| | $20,000 \leq V < 25,000$ | 0 | 0 | 5 | 22 | 102 | 228 |
| | $25,000 \leq V < 30,000$ | 0 | 0 | 0 | 4 | 38 | 152 |
| | $30,000 \leq V$ | 0 | 0 | 0 | 0 | 25 | 88 |
| Inclusions | Visible light observation | nil | nil | nil | nil | nil | found |
| | UV observation | nil | nil | nil | found | nil | nil |

Japanese Patent Application No. 2011-178758 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a titania-doped quartz glass, comprising the steps of:
   mixing a silicon-providing reactant gas and a titanium-providing reactant gas,
   heating the reactant gas mixture at 200 to 400° C.,
   subjecting the mixture to oxidation or flame hydrolysis with the aid of a combustible gas and a combustion-supporting gas,
   depositing a titania doped quartz glass, and
   forming an EUV lithography member having a surface for reflecting EUV light, the surface being free of concave defects having a volume of at least 30,000 nm³ and an aspect ratio of up to 10 in an effective region.

2. The method of claim 1, wherein the step of subjecting the mixture to oxidation or flame hydrolysis is performed by a burner for injecting the reactant gas mixture, the combustible gas, and the combustion-supporting gas, the burner including a central tube for injecting the reactant gas mixture, a glass or glass-lined conduit being connected at its downstream end to the central tube for feeding the reactant gas mixture through the glass or glass-lined conduit to the central tube, and
   the step of heating the reactant gas mixture is performed in the glass or glass-lined conduit.

3. The method of claim 2, wherein a metal conduit is connected to the glass or glass-lined conduit at its upstream end, and
   an upstream end portion of the glass or glass-lined conduit connected to the metal conduit is held at 100 to 130° C.

4. The method of claim 1, wherein the burner comprises a central multi-fold tube section and a multi-nozzle section, the central multi-fold tube section including the central tube and a second tube enclosing the central tube, and
   the reactant gas mixture is injected through the central tube, and the combustion-supporting gas is injected through the second tube while being heated at 200 to 400° C.

5. The method of claim 1, wherein the silicon-providing reactant gas is selected from the group consisting of silicon tetrachloride, dimethyldichlorosilane, methyltrichlorosilane, tetramethoxysilane, tetraethoxysilane, and methyltrimethoxysilane, and the titanium-providing reactant gas is selected from the group consisting of titanium tetrachloride, titanium tetrabromide, tetraethoxytitanium, tetraisopropoxytitanium, tetra-n-propoxytitanium, tetra-n-butoxytitanium, tetra-sec-butoxytitanium, and tetra-t-butoxytitanium.

6. A method for manufacturing a titania-doped quartz glass, comprising the steps of:
   mixing a silicon-providing reactant gas and a titanium-providing reactant gas,
   heating the reactant gas mixture at 300 to 400° C.,
   subjecting the mixture to oxidation or flame hydrolysis with the aid of a combustible gas and a combustion-supporting gas,
   depositing a titania doped quartz glass, and
   forming an EUV lithography member having a surface for reflecting EUV light, the surface being free of concave defects having a volume of at least 15,000 nm³ and an aspect ratio of up to 10 in an effective region,
   wherein the step of subjecting the mixture to oxidation or flame hydrolysis is performed by a burner for injecting the reactant gas mixture, the combustible gas, and the combustion-supporting gas, the burner including a central tube for injecting the reactant gas mixture, a glass or glass-lined conduit being connected at its downstream end to the central tube for feeding the reactant gas mixture through the glass or glass-lined conduit to the central tube, the step of heating the reactant gas mixture being performed in the glass or glass-lined conduit at 300 to 400° C., and a metal conduit is connected to the glass or glass-lined conduit at its upstream, the upstream end portion of the glass or glass-lined conduit connected to the metal conduit being held at 100 to 130° C.

* * * * *